(12) United States Patent
Lee

(10) Patent No.: US 8,766,686 B2
(45) Date of Patent: Jul. 1, 2014

(54) SEMICONDUCTOR DEVICE AND METHOD FOR DRIVING THE SAME

(75) Inventor: Jung-Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 108 days.

(21) Appl. No.: 13/603,539

(22) Filed: Sep. 5, 2012

(65) Prior Publication Data

US 2014/0015574 A1    Jan. 16, 2014

(30) Foreign Application Priority Data

Jul. 16, 2012  (KR) .......................... 10-2012-0077212

(51) Int. Cl.
*H03L 7/06* (2006.01)
(52) U.S. Cl.
USPC ............ 327/158; 327/142; 327/149; 327/161
(58) Field of Classification Search
CPC ... H03L 7/0812; H03L 7/0814; H03L 7/0816; H03L 7/0818; H03L 7/10; H03L 7/104
USPC ........................... 327/142, 149, 153, 158, 161
See application file for complete search history.

(56) References Cited

U.S. PATENT DOCUMENTS

| | | | | |
|---|---|---|---|---|
| 7,098,714 B2* | 8/2006 | Lin | ............................... | 327/291 |
| 7,190,201 B2* | 3/2007 | Haerle et al. | .................. | 327/158 |
| 7,285,997 B2 | 10/2007 | Haerle et al. | | |
| 7,443,216 B2* | 10/2008 | Gomm et al. | .................. | 327/158 |
| 7,541,851 B2* | 6/2009 | Gomm et al. | .................. | 327/158 |
| 7,688,123 B2* | 3/2010 | Oh | ............................... | 327/158 |
| 8,026,748 B2* | 9/2011 | Yung et al. | .................... | 327/158 |
| 2002/0089361 A1* | 7/2002 | Stubbs et al. | .................. | 327/161 |

FOREIGN PATENT DOCUMENTS

KR          100810070          3/2008

* cited by examiner

*Primary Examiner* — Patrick O'Neill
(74) *Attorney, Agent, or Firm* — IP & T Group LLP

(57) ABSTRACT

A semiconductor device includes a delay locked loop (DLL) configured to generate a DLL clock signal by delaying a reference clock signal in response to a second delay amount tracked using a first delay amount as an initial delay amount, and track the second delay amount again by adjusting the first delay amount in response to a reset signal, and a DLL controller configured to activate the reset signal when the second delay amount deviates from a given range.

15 Claims, 8 Drawing Sheets

SEMICONDUCTOR DEVICE AND METHOD FOR DRIVING THE SAME

CROSS-REFERENCE TO RELATED APPLICATIONS

The present application claims priority of Korean Patent Application No. 10-2012-0077212, filed on Jul. 16, 2012, which is incorporated herein by reference in its entirety.

BACKGROUND

1. Field

Exemplary embodiments of the present invention relate to a semiconductor design technology, and more particularly, to a semiconductor device including a delay locked loop (DLL) and a method for driving the same.

2. Description of the Related Art

With the increase of integration degree, the semiconductor device has improved to increase the operation speed. To increase the operation speed, a synchronous memory device capable of operating in synchronization with an external clock signal, which is applied from outside, has emerged. The synchronous memory device includes a DLL to output data in synchronization with rising and falling edges of the external clock signal. The DLL compensates for a delay factor occurring in an internal circuit of the semiconductor memory device and generates an internal clock signal in response to the external clock signal. At this time, a state after when the internal dock signal is completely generated refers to locking.

FIG. 1 is a block diagram of a conventional semiconductor device.

Referring to FIG. 1, the semiconductor device 100 includes an input buffer 110, a DLL 120, a transmission line 130, and an output buffer 140. The input buffer 110 is configured to buffer an external clock signal EXTCLK and generate a reference clock signal REFCLK. The DLL 120 is configured to generate a DLL clock signal DLLCLK corresponding to the reference clock signal REFCLK. The transmission line 130 is configured to transmit the DLL clock signal DLLCLK. The output buffer 140 is configured to receive input data INT_DATA to output data DQ_DATA to the outside in response to the DLL clock signal DLLCLK, which is transmitted through the transmission line 130.

FIG. 2 is an internal configuration diagram of the DLL 120 illustrated in FIG. 1.

Referring to FIG. 2, the DLL 120 includes a variable delay unit 121, a replica delay unit 123, a phase comparison unit 125, and a delay control unit 127. The variable delay unit 121 is configured to generate the DLL clock signal DLLCLK by delaying the reference clock signal REFCLK by a first delay amount, which is required for locking in response to a delay control signal DLY_CTRL<0:n>. The replica delay unit 123 is configured to generate a feedback clock signal FDBCLK by delaying the DLL clock signal DLLCLK by a second delay amount occurring in an internal input or output path that includes the input buffer 110, the transmission line 130, and the output buffer 140. The phase comparison unit 125 is configured to compare a phase of the feedback clock signal FDBCLK to a phase of the reference clock signal REFCLK and generate a phase comparison signal PD based on the comparison result. The delay control unit 127 is configured to generate the delay control signal DLY_CTRL<0:n> in response to the phase comparison signal PD and an initial setting signal RESET.

Here, the variable delay unit 121 tracks the first delay amount based on a preset initial delay amount in response to the initial setting signal RESET and the delay control signal DLY_CTRL<0:n>.

The replica delay unit 123 reflects a delay amount obtained by modeling the internal input or output path into the DLL clock signal DLLCLK, and outputs the feedback clock signal FDBCLK.

The phase comparison unit 125 detects a phase difference between the feedback clock signal FDBCLK and the reference clock signal REFCLK, and outputs the phase comparison signal PD corresponding to the detection result.

The delay control unit 127 outputs the delay control signal DLY_CTRL<0:n> corresponding to a delay amount to be controlled in response to the phase comparison signal PD.

Hereafter, an operation of the semiconductor device 100 having the above-described configuration will be described with reference to FIG. 3.

FIG. 3 is a timing diagram for explaining the operation of the conventional semiconductor device 100.

Referring to FIG. 3, the input buffer 110 buffers the external clock signal EXTCLK and generates the reference clock signal REFCLK. Furthermore, the DLL 120 generates the DLL clock signal DLLCLK corresponding to the reference clock signal REFCLK. The detailed operation of the DLL 120 is performed as follows.

The variable delay unit 121 delays the reference clock signal REFCLK by the initial delay amount in response the initial setting signal RESET and outputs the DLL clock signal DLLCKL. The replica delay unit 123 delays the DLL clock signal DLLCLK by the second delay amount occurring in the internal input or output path and outputs the feedback clock signal FDBCLK. The phase comparison unit 125 compares the phase of the reference clock signal REFCLK to the phase of the feedback clock signal FDBCLK and outputs the phase comparison signal PD. After that, the delay control unit 127 outputs the delay control signal DLY_CTRL<0:n>, which corresponds to the phase comparison signal PD, to the variable delay unit 121. When such a loop is repeated so that the phase of the reference clock signal REFCLK coincides with the phase of the feedback clock signal FDBCLK, the DLL clock signal DLLCLK is finally locked. In other words, when the delay amount of the variable delay unit 121 is gradually tracked from the initial delay amount to the first delay amount through the repeated loops, the DLL clock signal DLLCLK is finally locked when the initial delay amount and the first delay amount become identical.

Accordingly, the output buffer 140 outputs the data DQ_DATA to the outside in response to the DLL clock signal DLLCLK.

According to the semiconductor device 100, the data DQ_DATA may be outputted to the outside in synchronization with the rising and falling edges of the external clock signal EXTCLK.

However, the semiconductor device 100 having the above-described configuration has the following concerns.

FIGS. 4A and 4B include timing diagrams illustrating a case in which the initial position of the feedback clock signal FDBCLK differs depending on variations of a process/voltage/temperature (PVT) condition and diagrams for explaining the process in which the first delay amount of the variable delay unit 121 is tracked according to the above-described case. FIGS. 5A and 5B are diagrams for explaining the concerns of the conventional semiconductor device in correspondence with FIGS. 4A and 4B.

When the initial position of the feedback clock signal FDBCLK is set as illustrated in FIG. 4A with respect to the reference clock signal REFCLK, the first delay amount of the variable delay unit 121 is decided through a sufficient number of loops. However, when the initial position of the feedback clock signal FDBCLK is set as illustrated in FIG. 4B with respect to the reference clock signal REFCLK, the first delay amount of the variable delay unit 121 is decided through an insufficient number of loops. In other words, in the case of FIG. 4A, a large delay amount is used to track the delay amount of the variable delay unit 121 to the first delay amount. In the case of FIG. 4B, however, a small delay amount is used to track the delay amount of the variable delay unit 121 to the first delay amount.

In this case, when the PVT condition varies, for example, the power supply voltage VDD decreases or the temperature increases after locking is completed, the first delay amount locked in the variable delay unit 121 and the second delay amount preset in the replica delay unit 123 may increase. Hereafter, for convenience of description, suppose that only the second delay amount preset in the replica delay unit 123 is affected by the variation of the PVT condition. When the second delay amount preset in the replica delay unit 123 increases, the position of the feedback clock signal FDBCLK is delayed by the increase of the second delay amount. In this case, the DLL 120 regenerates the DLL clock signal DLLCLK through a loop. More specifically, when the phase comparison unit 125 outputs the phase comparison signal PD for adjusting the distorted phase of the feedback clock DLLCLK to the phase of the reference clock signal REFCLK, and the delay control unit 127 generates the delay control signal DLY_CTRL<0:n> corresponding to the phase comparison signal PD, the variable delay unit 121 reduces the locked first delay amount. At this time, when a large delay amount is used to track the first delay amount as illustrated in FIG. 4A, the delay amount for reducing the first delay amount is sufficient as illustrated in FIG. 5A. However, when a small delay amount is used to track the first delay amount as illustrated in FIG. 4B, the delay amount for reducing the first delay amount is insufficient as illustrated in FIG. 5B. In other words, when the locked first delay amount is larger than the increase of the second delay amount based on the variation of the PVT condition, the delay amount for reducing the first delay amount becomes insufficient. Therefore, when the first delay amount required for locking was tracked by using a small delay amount, the first delay amount may not be sufficient, if the PVT condition varies after locking is completed. In this case, the delay amount required for locking may not be precisely tracked to the locking point.

SUMMARY

Exemplary embodiments of the present invention is directed to a semiconductor device in which a delay amount required for locking a DLL is set to a threshold value or more and a method for driving the same.

In accordance with an exemplary embodiment of the present invention, a semiconductor device includes a DLL configured to generate a DLL clock signal by delaying a reference clock signal in response to a second delay amount tracked using a first delay amount as an initial delay amount, and track the second delay amount again by adjusting the first delay amount in response to a reset signal, and a DLL controller configured to activate the reset signal when the second delay amount deviates from a given range.

In accordance with another exemplary embodiment of the present invention, a semiconductor device includes a DLL configured to track a second delay amount for locking a reference clock signal using a first delay amount as an initial delay amount in response to an initial setting signal, and to track a fourth delay amount for locking the reference clock signal using a third delay amount larger than the first delay amount as an initial delay amount in response to a reset signal when the second delay amount is equal to or less than a predetermined threshold value, and generate a DLL clock signal by delaying the reference clock signal by the second delay amount or the fourth delay amount depending on whether the second delay amount is equal to or less than the predetermined threshold value, and a DLL controller configured to generate the reset signal in response to an external clock signal and a locking end signal outputted from the DLL.

In accordance with yet another exemplary embodiment of the present invention, a method for driving a semiconductor device includes tracking a second delay amount for locking a reference clock signal using a first delay amount as an initial delay amount in response to an initial setting signal, and generating a DLL clock signal by delaying the reference clock signal by the second delay amount, generating a reset signal by determining whether or not the DLL clock signal is locked before a predetermined time, and tracking a fourth delay amount for locking the reference clock signal by adjusting a third delay amount larger than the first delay amount to the initial delay amount in response to the reset signal, and regenerating the DLL clock signal by delaying the reference clock signal by the fourth delay amount.

DETAILED DESCRIPTION

Figure 1:
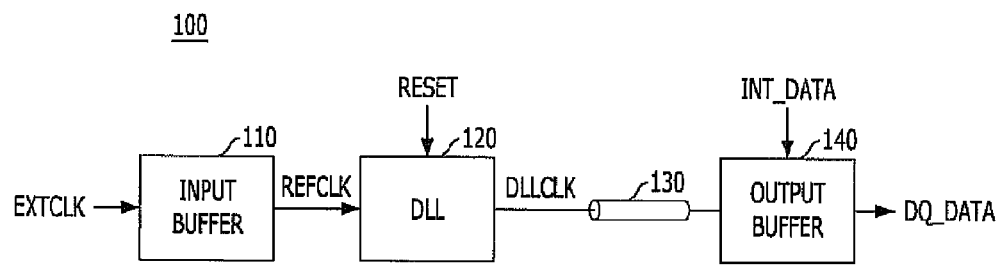
FIG. 1 is a block diagram of a conventional semiconductor device.
Figure 2:
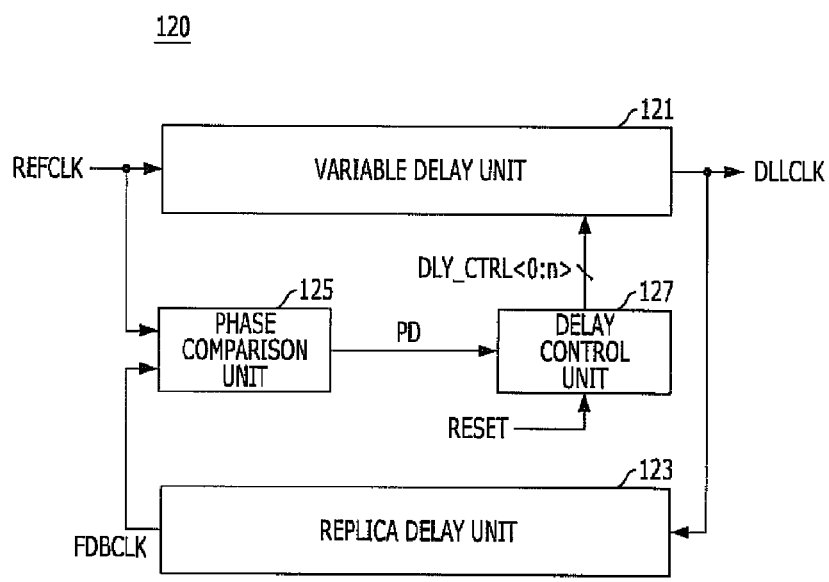
FIG. 2 is an internal configuration diagram of the DLL illustrated in FIG. 1.
Figure 3:
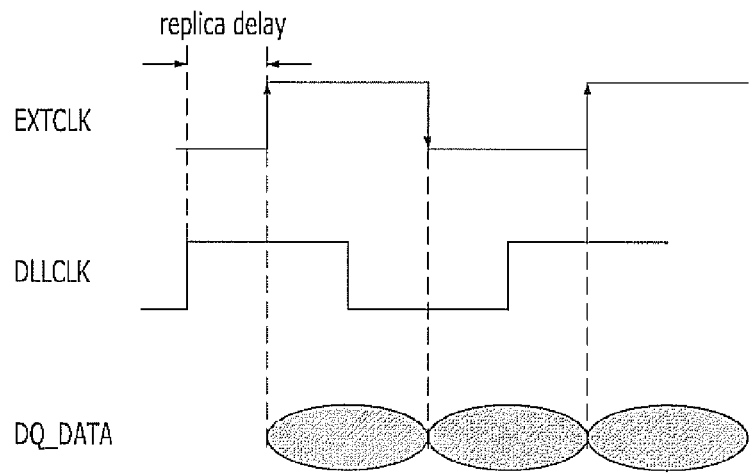
FIG. 3 is a timing diagram for explaining the operation of the conventional semiconductor device.
Figure 4A:
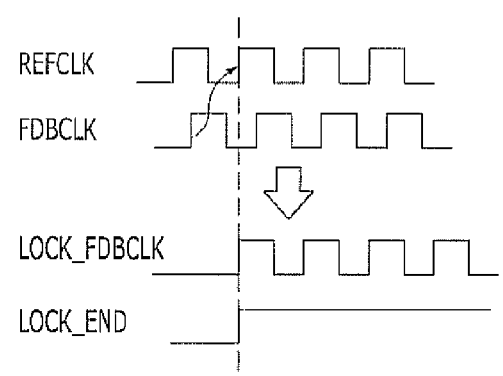
FIGS. 4A and 4B include a timing diagram illustrating a case in which the initial position of a feedback clock signal differs depending on variations of a process/voltage/temperature (PVT) condition and a diagram for explaining a process in which a first delay amount of a variable delay unit is tracked according to the above-described case.
Figure 4A:
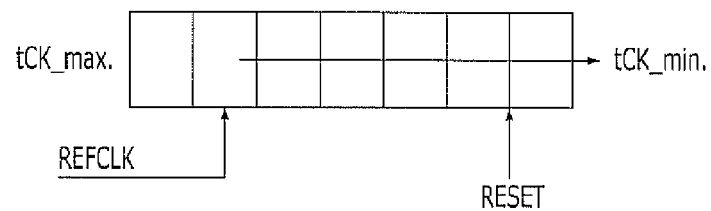
Figure 4B:
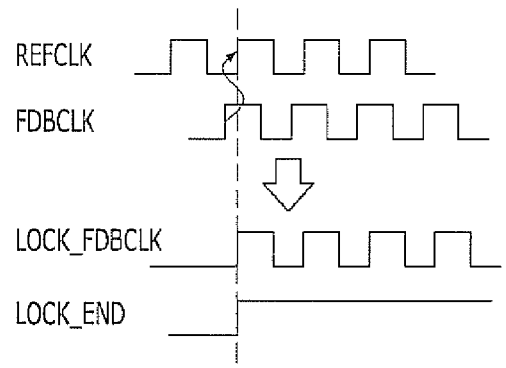
Figure 4B:
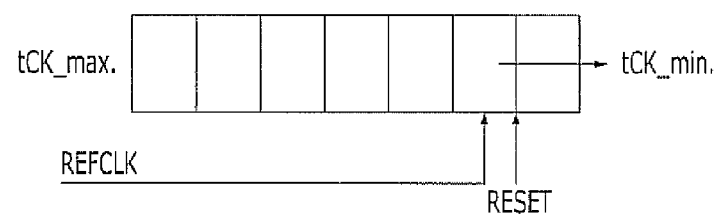
Figure 5A:
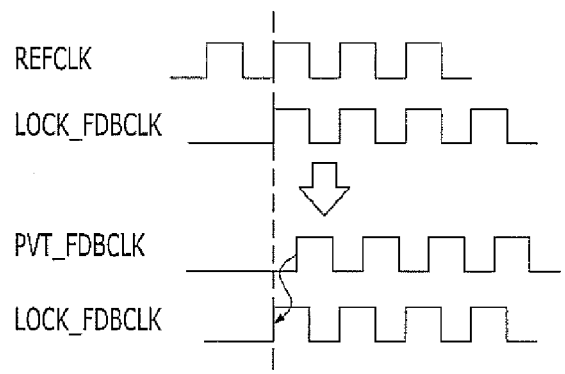
FIGS. 5A and 5B are diagrams for explaining the problems of the present invention in correspondence to FIGS. 4A and 4B.
Figure 5A:
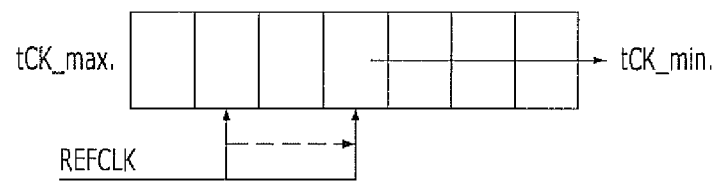
Figure 5B:
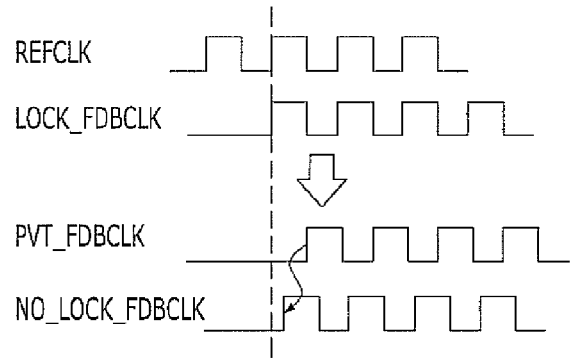
Figure 5B:
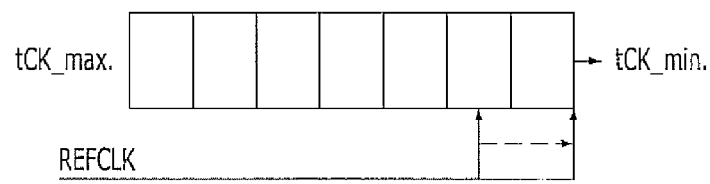

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 6:
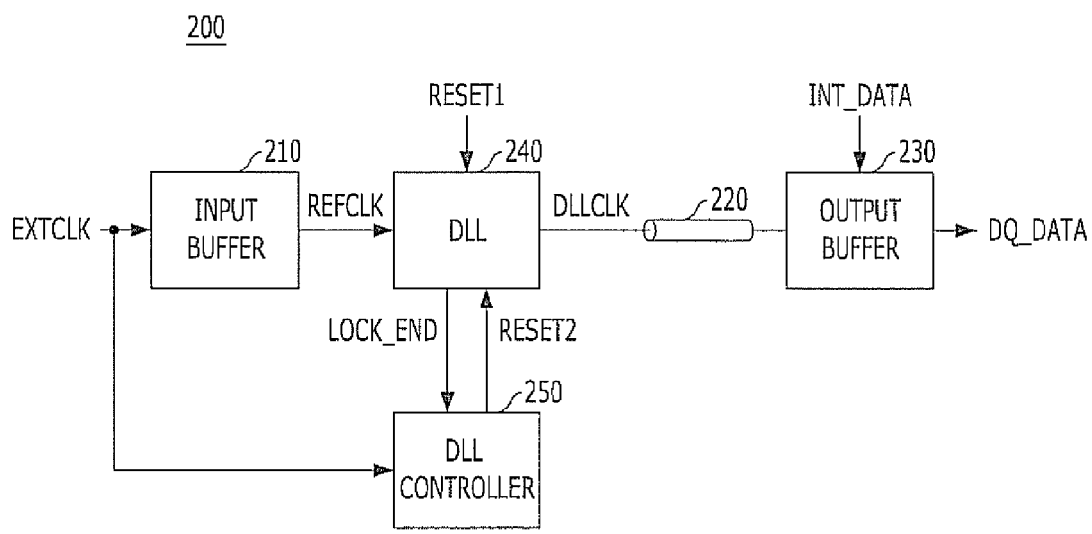
FIG. 6 is a block diagram of a semiconductor device in accordance with an embodiment of the present invention.

FIG. 6 is a block diagram of a semiconductor device in accordance with an embodiment of the present invention.

Referring to FIG. 6, the semiconductor device 200 includes an input buffer 210, a transmission line 220, an output buffer 230, a DLL 240, and a DLL controller 250. The input buffer 210 is configured to buffer an external clock signal EXTCLK and generate a reference clock signal REFCLK. The transmission line 220 is configured to transmit a DLL clock signal DLLCLK generated from the DLL 240. The output buffer 230 is configured to receive input data INT_DATA to output data DQ_DATA to the outside in response to the DLL clock signal DLLCLK, which is transmitted through the transmission line 220. The DLL 240 is configured to generate the DLL clock signal DLLCLK by delaying the reference clock signal REFCLK by a second delay amount tracked by using an initial setting signal RESET1 as an initial delay amount, and track the second delay amount again by adjusting the first delay amount in response to a reset signal RESET2. The DLL controller 250 is configured to activate the reset signal RESET2 when the first delay amount deviates from a given range. Hereafter, a value obtained by controlling the first delay amount is referred to as a third delay amount, and a value obtained by tracking the second delay amount again is referred to as a fourth delay amount.

Figure 7:
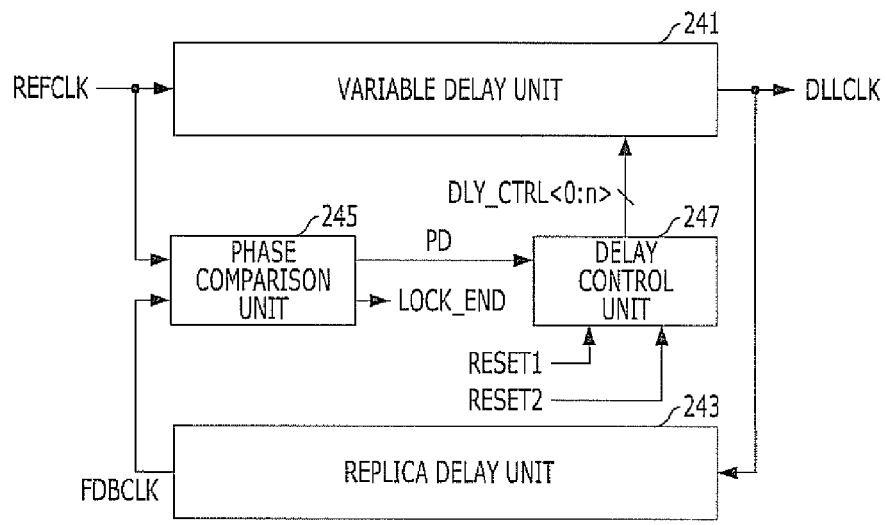
FIG. 7 is an internal configuration diagram of a DLL illustrated in FIG. 6.
Figure 8:
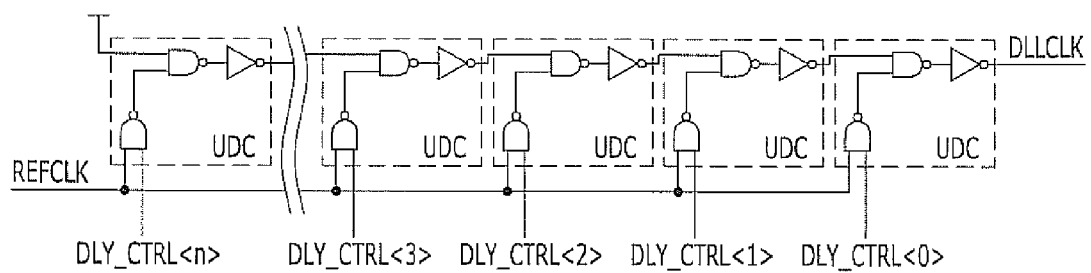
FIG. 8 is an internal configuration diagram of a variable delay unit illustrated in FIG. 7.

FIG. 7 is an internal configuration diagram of the DLL 240 illustrated in FIG. 6. FIG. 8 is an internal configuration diagram of a variable delay unit 241 illustrated in FIG. 7.

Referring to FIG. 7, the DLL 240 includes a variable delay unit 241, a replica delay unit 243, a phase comparison unit 245, and a delay control unit 247. The variable delay unit 241 is configured to generate the DLL clock signal DLLCLK by delaying the reference clock signal REFCLK by the second or fourth delay amount in response to the delay control signal DLY_CTRL<0:n>. The replica delay unit 243 is configured to generate the feedback clock signal FDBCLK by delaying the DLL clock signal DLLCLK by a fifth delay amount is occurring in an internal input or output path that includes the input buffer 210, the transmission line 220, and the output buffer 230. The phase comparison unit 245 is configured to compare a phase of the feedback clock signal FDBCLK with a phase of the reference clock signal REFCLK and generate a phase comparison signal PD and a locking end signal LOCK_END in response to the comparison result.

The delay control unit 247 is configured to generate the delay control signal DLY_CTRL<0:n> in response to the phase comparison signal PD, the initial setting signal RESET1, and the reset signal RESET2.

Here, the variable delay unit 241 tracks the second delay amount by using the first delay amount as an initial delay amount in response to the delay control signal DLY_CTRL<0:n> or tracks the fourth delay amount by using the third delay amount as the initial delay amount in response to the delay control signal DLY_CTRL<0:n>. Referring to FIG. 8, the variable delay unit 241 may have a structure in which each of a plurality of unit delay cells (UDC) has NAND gates and an inverter, which are connected in series. In this case, as the number of UDCs is controlled in response to the delay control signal DLY_CTRL<0:n>, a delay amount that is subsequently reflected into the reference clock signal REFCLK is controlled. For example, each of the UDCs includes a first NAND gate configured to perform a NAND operation on a corresponding delay control signal DLY_CTRL<k> and the reference clock signal REFCLK. Each of the UDCs also includes a second NAND gate configured to perform a NAND operation on an output of the first NAND gate and an output of an UDC positioned at the previous stage. Each of the UDCs also includes an inverter configured to invert an output of the second NAND gate. Here, the UDC positioned at one end of the structure, among the plurality of UDCs, is connected to a power supply terminal VDD instead of an output of the UDC positioned at the previous stage.

Referring to FIG. 7, the replica delay unit 243 is configured to reflect a delay amount obtained by modeling the internal input or output path into the DLL clock signal DLLCLK and output the feedback clock signal FDBCLK. For reference, the replica delay unit 243 may be modeled by simplifying a target circuit to model the internal input or output path, or designed by modeling the target circuit as it is.

The phase comparison unit 245 is configured to compare and detect a phase difference between the feedback clock signal FDBCLK and the reference clock signal REFCLK. Then, the phase comparison unit 245 is configured to output the phase comparison signal PD corresponding to the detection result and the locking end signal LOCK_END. In other words, when it is determined that the phase of the feedback clock signal FDBCLK coincides with the phase of the reference clock signal REFCLK, then the phase comparison unit 245 activates the locking end signal LOCK_END.

Furthermore, the delay control unit 247 is configured to output the delay control signal DLY_CTRL<0:n> corresponding to the initial delay amount in response to the initial setting signal RESET1 and the reset signal RESET2. In this case, the delay control unit 247 may output the delay control signal DLY_CTRL<0:n> corresponding to a delay amount to be controlled in response to the phase comparison signal PD. For example, the delay control unit 247 may include a bidirectional shift register.

The DLL 240 that has the above-described configuration tracks the second delay amount for locking the reference clock signal REFCLK by using the first delay amount as the initial delay amount in response to the initial setting signal RESET1. When the second delay amount is equal to or less than a predetermined threshold value, the DLL 240 tracks the fourth delay amount for locking the reference clock signal REFCLK by using the third delay amount, which is larger than the first delay amount, as the initial delay amount in response to the reset signal RESET2. Then, the DLL 240 generates the DLL clock signal DLLCLK by delaying the reference clock signal REFCLK by the second or fourth delay amount depending on whether or not the second delay amount is equal to or less than the predetermined threshold value.

Figure 9:
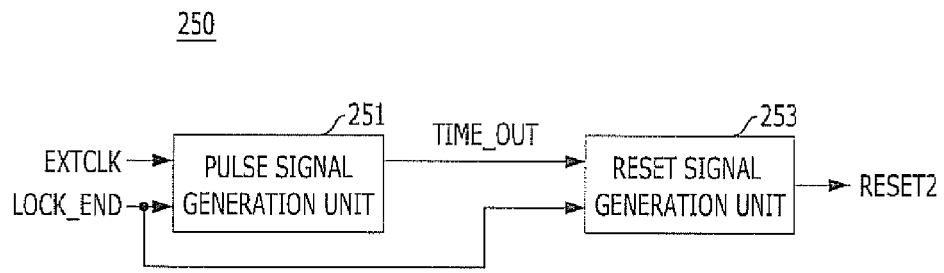
FIG. 9 is an internal configuration diagram of a DLL controller illustrated in FIG. 6.
Figure 10:
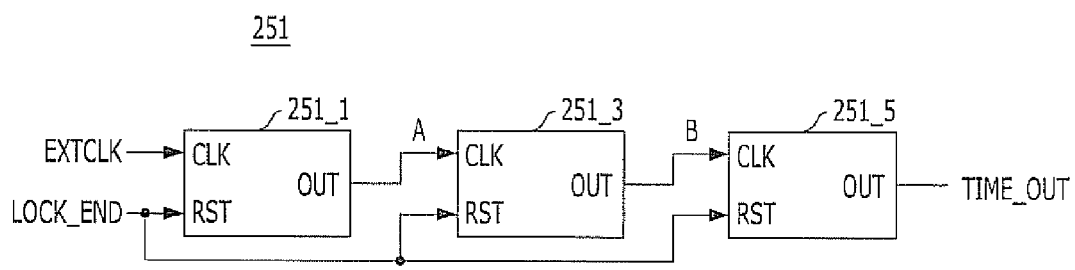
FIG. 10 is an internal configuration diagram of a pulse signal generation unit illustrated in FIG. 9.
Figure 11:
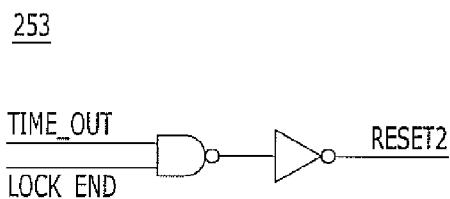
FIG. 11 is an internal configuration diagram of a reset signal generation unit illustrated in FIG. 9.

FIG. 9 is an internal configuration diagram of the DLL controller 250 illustrated in FIG. 6. FIG. 10 is an internal configuration diagram of a pulse signal generation unit illustrated in FIG. 9. FIG. 11 is an internal configuration diagram of a reset signal generation unit illustrated in FIG. 9.

Referring to FIG. 9, the DLL controller 250 includes a pulse signal generation unit 251 and a reset signal generation unit 253. The pulse signal generation unit 251 is configured to generate a pulse signal TIME_OUT, which has a pulse period corresponding to a predetermined threshold value, in response to the external clock signal EXTCLK and the locking end signal LOCK_END. The reset signal generation unit 253 is configured to generate the reset signal RESET2 in response to the pulse signal TIME_OUT and the locking end signal LOCK_END.

Here, the pulse signal generation unit 251 may be configured to divide the external clock signal EXTCLK at a predetermined division ratio and generate the pulse signal TIME_OUT. For example, the pulse signal generation unit 251 may include first to third T flip-flops 251_1, 251_3, and 251_5 as illustrated in FIG. 10. The first T flip-flop 251_1 is configured to divide the external clock signal EXTCLK. The second T flip-flop 251_3 is configured to divide a clock signal A, which is divided by the first T flip-flop 251_1, and the third T flip-flop 251_5 is configured to divide a clock signal B, which is divided by the second T flip-flop 251_3. Then, the pulse signal generation unit 251 is configured to output the pulse signal TIME_OUT. Meanwhile, the dividing operations of the first to third T flip-flops 251_1, 251_3, and 251_5 are controlled in response to the locking end signal LOCK_END. When the locking end signal LOCK_END is activated, the first to third T flip-flops 251_1, 251_3, and 251_5 do not perform a dividing operation. It has been described that the pulse signal generation unit 251 includes the first to third T flip-flops 251_1, 251_3, and 251_5. However, the present invention is not limited thereto. The pulse signal generation unit 251 may include a smaller number of T flip-flops or a larger number of T flip-flops in response to the predetermined threshold value.

The reset signal generation unit 253 may be configured to compare the pulse signal TIME_OUT with the locking end signal LOCK_END. When the locking end signal LOCK_END is activated within the pulse period of the pulse signal TIME_OUT, the reset signal generation unit 253 is configured to activate the reset signal RESET2. Referring to FIG. 11, the reset signal generation unit 253 includes a NAND gate configured to perform a NAND operation on the pulse signal TIME_OUT and the locking end signal LOCK_END. The reset signal generation unit 253 also includes an inverter configured to invert an output signal of the NAND gate and output the inverted signal as the reset signal RESET2.

Hereafter, a method for driving the semiconductor device 200 in accordance with the embodiment of the present invention will be described with reference to FIGS. 12 to 14.

Figure 12:
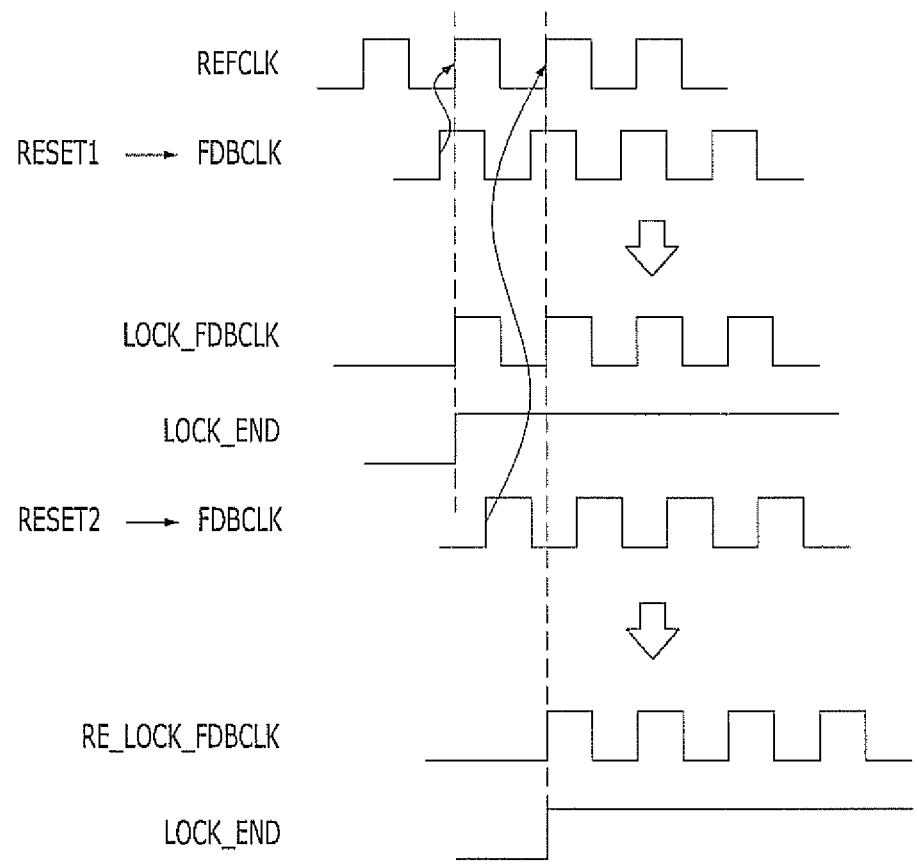
FIG. 12 includes a timing diagram for explaining a method for driving the semiconductor device in accordance with the embodiment of the present invention and a diagram for explaining a process in which a delay amount of the variable delay unit is tracked according to the driving method.
Figure 12:
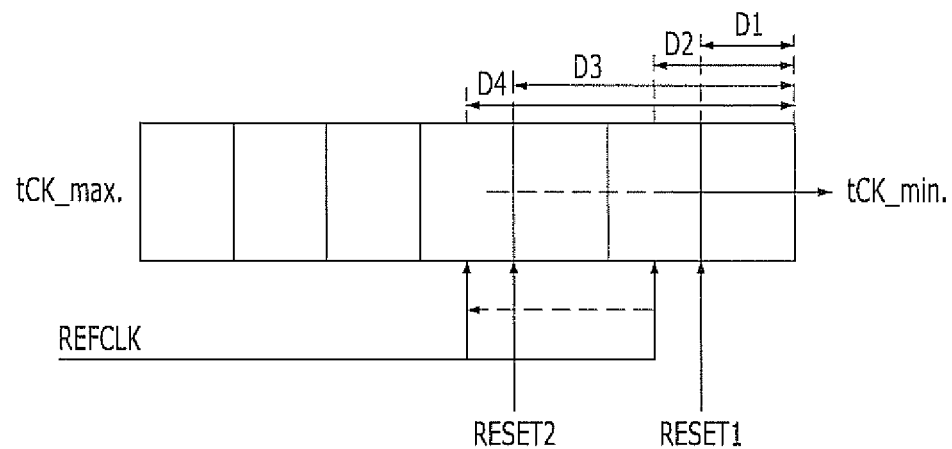
Figure 13:
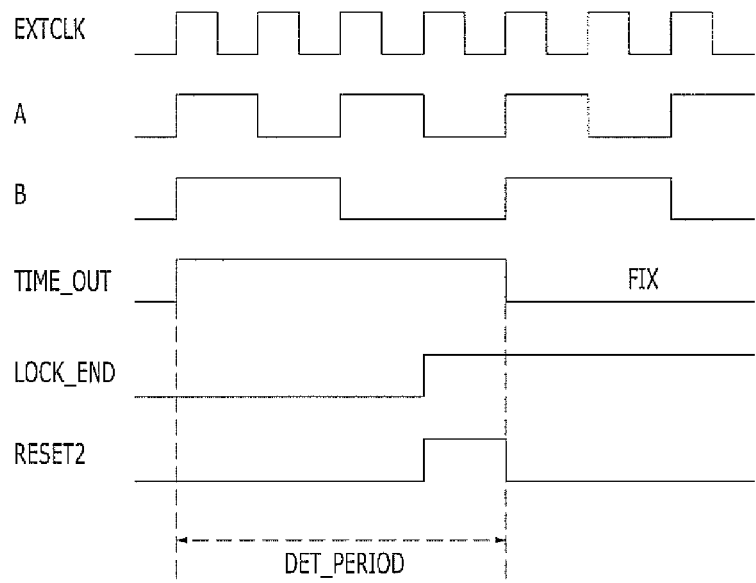
FIG. 13 is a timing diagram for explaining a process in which a reset signal is activated in FIG. 12.

FIG. 12 includes a timing diagram for explaining the method for driving the semiconductor device 200 in accordance with the exemplary embodiment of the present invention and a diagram for explaining a process in which the delay amount of the variable delay unit 241 is tracked according to the driving method. FIG. 13 is a timing diagram for explaining a process in which the reset signal is activated in FIG. 12.

Referring to FIG. 12, a first locking step is performed, in which the DLL tracks a second delay amount D2 for locking the reference clock signal REFCLK by using a first delay amount D1 as an initial delay amount in response to the initial setting signal RESET1. DLL generates the DLL clock signal DLLCLK by delaying the reference clock signal REFCLK by the second delay amount D2. The tracking process at the first locking step will be described in detail. When the delay control unit 247 generates the delay control signal DLY_CTRL<0:n> that corresponds to the initial setting signal RESET1, the variable delay unit 241 sets the first delay amount D1 to the initial delay amount in response to the delay control signal DLY_CTRL<0:n>, and delays the reference clock signal REFCLK by the first delay amount D1 to output the DLL clock signal DLLCLK. The replica delay unit 243 delays the DLL clock signal DLLCLK by the fifth delay amount occurring in the internal input or output path that includes the input buffer 210, the transmission line 220, and the output buffer 230, and outputs the feedback clock signal FDBCLK. The phase comparison unit 245 compares the phase of the feedback clock signal FDBCLK with the phase of the reference clock signal REFCLK and outputs the phase comparison signal PD based on the comparison result. Accordingly, when the delay control unit 247 outputs the delay control signal DLY_CTRL<0:n> that corresponds to the phase comparison signal PD, the delay amount of the variable delay unit 241 is adjusted to a delay amount, which is larger than the first delay amount D1. Then, the above-described loop is repetitively performed. When the phases of the feedback clock signal FDBCLK and the reference clock signal REFCLK coincide with each other through the repetitively-performed loops, the locking is finally completed. At this time, the delay amount of the variable delay unit 241 is adjusted to the second delay amount D2.

Then, a determination step is performed to determine whether or not the DLL clock signal DLLCLK was locked before a predetermined time. At the determination step, the lock time of the DLL clock signal DLLCLK is detected in response to the external clock signal EXTCLK and the locking end signal LOCK_END, which is activated when the DLL clock signal DLLCLK is locked. When the detected lock time is shorter than the predetermined time, the reset signal RESET2 is activated. This step will be described in more detail with reference to FIG. 13. Referring to FIG. 13, the determination step is performed as follows. The pulse signal generation unit 251 divides the external clock signal EXTCLK at a predetermined division ratio, and generates the pulse signal TIME_OUT having a pulse period DET_PERIOD that corresponds to a predetermined time. When the DLL clock signal DLLCLK is locked, the locking end signal LOCK_END activated by the phase comparison unit 245 is compared with the pulse signal TIME_OUT. When the locking end signal LOCK_END is activated within the pulse period of the pulse signal TIME_OUT, the reset signal RESET2 is activated as the comparison result. In short, when the locking end signal LOCK_END is activated within the pulse period of the pulse signal TIME_OUT, it is determined that the DLL clock signal DLLCLK was locked before the predetermined time.

Then, a second locking step is performed. At the second locking step, when it is determined that the DLL clock signal DLLCLK is locked before the predetermined time, the fourth delay amount D4 for locking the reference clock signal REFCLK is tracked by adjusting the third delay amount D3, which is larger than the first delay amount D1, to the initial delay amount in response to the activated reset signal RESET2. The DLL clock signal DLLCLK is regenerated by delaying the reference clock signal REFCLK by the fourth delay amount D4. The tracking process at the second locking step will be described in detail as follows. When the delay control unit 247 generates the delay control signal DLY_CTRL<0:n> that corresponds to the reset signal RESET2, the variable delay unit 241 sets the third delay amount D3 to the initial delay amount in response to the delay control signal DLY_CTRL<0:n>. The variable delay unit 241 delays the reference clock signal REFCLK by the third delay amount D3 to output the DLL clock signal DLLCLK. Furthermore, the replica delay unit 243 delays the DLL clock signal DLLCLK by the fifth delay amount occurring in the internal input or output path including the input buffer 210, the transmission line 220, and the output buffer 230, and outputs the feedback clock signal FDBCLK. The phase comparison unit 245 compares the phase of the feedback clock signal FDBCLK with the phase of the reference clock signal REFCLK, and outputs the phase comparison signal PD corresponding to the comparison result. Accordingly, when the delay control unit 247 outputs the delay control signal DLY_CTRL<0:n> that corresponds to the phase comparison signal PD, the delay amount of the variable delay unit 241 is adjusted to a delay amount, which is larger than the third delay amount D3. Then, the above-described loop is repetitively performed. When the phase comparison unit 245 determines that the phase of the feedback clock signal FDBCLK coincides with the phase of the reference clock signal REFCLK through the repetitively-performed loops, the locking is finally completed. At this time, the delay amount of the variable delay unit 241 is adjusted to the fourth delay amount D4.

When the PVT condition varies (e.g., the power supply voltage decreases or the temperature increases) in a state in which the delay amount required for locking is adjusted to the fourth delay amount D4. The second locking step is completed, and the fifth delay amount preset in the replica delay unit 243 increases. The position of the feedback clock signal FDBCLK is delayed by the increase of the fifth delay amount. Accordingly, a third locking step is performed to adjust the distorted phase of the feedback clock signal FDBCLK to the phase of the reference clock signal REFCLK. At this time, because the delay amount of the variable delay unit 241 is sufficiently secured as the fourth delay amount D4, the delay amount required for locking may be precisely tracked to the original locking point, even though the delay amount of the variable delay unit 241 is reduced.

Figure 14:
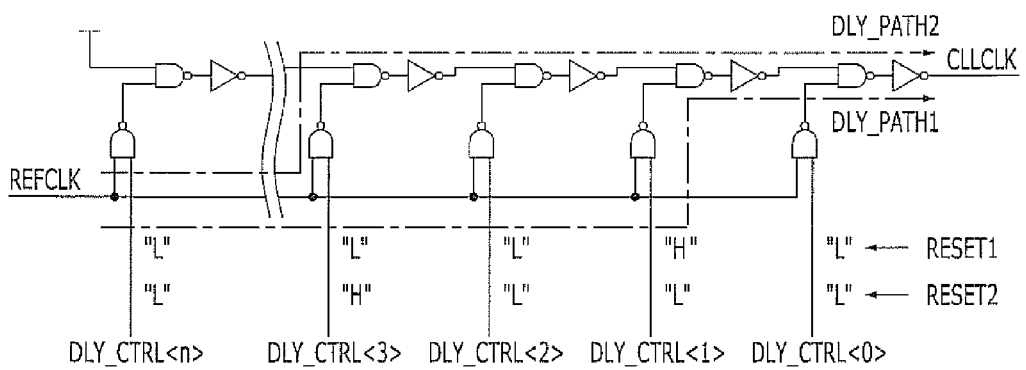
FIG. 14 is a diagram for explaining a process in which the initial delay amount of the variable delay unit is adjusted in FIG. 12.

FIG. 14 is a diagram for explaining a process in which the initial delay amount of the variable delay unit 241 is adjusted in FIG. 12.

Referring to FIG. 14, as the delay control unit 247 generates the delay control signal DLY_CTRL<0:n> that corresponds to the initial setting signal RESET1. The initial delay amount of the variable delay unit 241 is set in response to the delay control signal DLY_CTRL<0:n>. For example, when the delay control signal DLY_CTRL<0:n> that corresponds to the initial setting signal RESET1 is generated in such a manner that the reference clock signal REFCLK passes through two UDCs among the plurality of UDCs, which are included in the variable delay unit 241, the variable delay unit 241 provides a first delay path DLY_PATH so that the reference clock signal REFCLK is outputted as the DLL clock signal DLLCLK through the two UDCs. Furthermore, as the delay control unit 247 generates the delay control signal DLY_CTRL<0:n> that corresponds to the reset signal RESET2, the initial delay amount of the variable delay unit 241 is set in correspondence to the delay control signal DLY_CTRL<0:n>. For example, when the delay control signal DLY_CTRL<0:n> that corresponds to the reset signal RESET2 is generated in such a manner that the reference clock signal REFCLK passes through four UDCs among the plurality of UDCs, which are included in the variable delay unit 241, the variable delay unit 241 provides a second delay path DLY_PATH2 so that the reference clock signal REFCLK is outputted as the DLL clock signal DLLCLK through the fourth UDCs.

In accordance with the embodiment of the present invention, as the delay amount required for locking is adjusted to a predetermined delay amount or more, the delay amount required for locking may be precisely tracked to the locking point even though the PVT condition varies after locking.

Therefore, although the locking process is performed again due to a PVT variation after the initial locking process, the delay amount for locking is sufficient. Accordingly, it is possible to prevent a failure that occurs when the delay amount is not precisely tracked to the locking point.

While the present invention has been described with respect to the specific embodiments, it will be apparent to those skilled in the art that various changes and modifications may be made without departing from the spirit and scope of the invention as defined in the following claims.

For example, it has been described that the process of tracking the delay amount of the variable delay unit again is performed one time. However, the present invention is not limited thereto. The process may be performed two or more times, as long as the locking time is sufficiently guaranteed. In this case, the initial delay amount of the variable delay unit needs to be adjusted whenever tracking is performed again.

What is claimed is:

1. A semiconductor device comprising:
a delay locked loop (DLL) configured to generate a DLL clock signal by delaying a reference clock signal in response to a second delay amount tracked using a first delay amount as an initial delay amount, and track the second delay amount again by adjusting the first delay amount in response to a reset signal; and
a DLL controller configured to activate the reset signal when the second delay amount deviates from a given range.

2. The semiconductor device of claim 1, wherein the DLL performs the process of tracking the second delay amount again one or more times.

3. A semiconductor device comprising:
a delay locked loop (DLL) configured to track a second delay amount for locking a reference clock signal using a first delay amount as an initial delay amount in response to an initial setting signal, and to track a fourth delay amount for locking the reference clock signal using a third delay amount larger than the first delay amount as the initial delay amount in response to a reset signal when the second delay amount is equal to or less than a predetermined threshold value, and generate a DLL clock signal by delaying the reference clock signal by the second delay amount or the fourth delay amount depending on whether the second delay amount is equal to or less than the predetermined threshold value; and
a DLL controller configured to generate the reset signal in response to an external clock signal and a locking end signal outputted from the DLL.

4. The semiconductor device of claim 3, wherein the DLL controller comprises:
a pulse signal generation unit configured to generate a pulse signal corresponding to the predetermined threshold value in response to the external clock signal; and
a reset signal generation unit configured to generate the reset signal in response to the pulse signal and the locking end signal.

5. The semiconductor device of claim 4, wherein the pulse signal generation unit comprises a divider configured to generate the pulse signal by dividing the external clock signal at a predetermined division ratio.

6. The semiconductor device of claim 4, wherein the pulse signal generation unit fixes the pulse signal to a predetermined voltage level after a predetermined period, in response to the locking end signal.

7. The semiconductor device of claim 4, wherein the reset signal generation unit comprises a logic operation section configured to perform a logic operation on the pulse signal and the locking end signal.

8. The semiconductor device of claim 4, wherein the reset signal generation unit activates the reset signal when the locking end signal is activated within a pulse period of the pulse signal.

9. The semiconductor device of claim 3, wherein the DLL comprises:
   a variable delay unit configured to generate the DLL clock signal by delaying the reference clock signal by the second or fourth delay amount in response to a delay control signal;
   a replica delay unit configured to generate a feedback clock signal by delaying the DLL clock signal by a fifth delay amount occurring in an internal input/output path;
   a phase comparison unit configured to compare a phase of the feedback clock signal with a phase of the reference clock signal and generate a phase comparison signal and the locking end signal in response to the comparison result; and
   a delay control unit configured to generate the delay control signal in response to the phase comparison signal, the initial setting signal, and the reset signal.

10. The semiconductor device of claim 9, wherein the variable delay unit comprises a structure where a plurality of unit delay cells are connected in series.

11. The semiconductor device of claim 10, wherein the variable delay unit controls a delay amount to be reflected into the reference clock signal by adjusting the number of unit delay cells in response to the delay control signal.

12. The semiconductor device of claim 9, further comprising:
   an input buffer configured to generate the reference clock signal by buffering the external clock signal; and
   an output buffer configured to output data to the outside in response to the DLL clock signal,
   wherein the internal input/output path comprises the input buffer and the output buffer.

13. A method for driving a semiconductor device, comprising:
   tracking a second delay amount for locking a reference clock signal using a first delay amount as an initial delay amount in response to an initial setting signal, and generating a delay locked loop (DLL) clock signal by delaying the reference clock signal by the second delay amount;
   generating a reset signal by determining whether or not the DLL clock signal is locked before a predetermined time; and
   tracking a fourth delay amount for locking the reference clock signal by adjusting a third delay amount larger than the first delay amount to the initial delay amount in response to the reset signal, and regenerating the DLL clock signal by delaying the reference clock signal by the fourth delay amount.

14. The method of claim 13, wherein the generating of a reset signal comprises:
   detecting a lock time of the DLL clock signal in response to an external clock signal and a locking end signal activated when the DLL clock signal is locked; and
   activating the reset signal when the detected lock time is shorter than the predetermined time.

15. The method of claim 13, wherein the generating of a reset signal comprises:
   dividing an external clock signal at a predetermined division ratio, and generating a pulse signal having a predetermined pulse period;
   comparing the pulse signal with a locking end signal activated when the DLL clock signal is locked; and
   activating the reset signal when the locking end signal is activated within the puke period, in response to the comparison result.

* * * * *